United States Patent
Sbiaa et al.

(10) Patent No.: US 7,583,480 B2
(45) Date of Patent: Sep. 1, 2009

(54) MAGNETORESISTANCE EFFECT ELEMENT WITH NANO-JUNCTION BETWEEN FREE AND PINNED LAYERS

(75) Inventors: Rachid Sbiaa, Tokyo (JP); Isamu Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 385 days.

(21) Appl. No.: 11/019,306

(22) Filed: Dec. 23, 2004

(65) Prior Publication Data

US 2005/0141147 A1  Jun. 30, 2005

(30) Foreign Application Priority Data

Dec. 24, 2003  (JP)  ............ P.2003-427975

(51) Int. Cl.
*G11B 5/39* (2006.01)
(52) U.S. Cl. .............................. 360/324.1; 360/324.2
(58) Field of Classification Search ................ 360/126, 360/324–324.2
See application file for complete search history.

(56) References Cited

U.S. PATENT DOCUMENTS

| | | | | |
|---|---|---|---|---|
| 6,127,045 A * | 10/2000 | Gill | ............................ | 428/611 |
| 6,365,286 B1 * | 4/2002 | Inomata et al. | ........... | 428/811.1 |
| 6,560,077 B2 * | 5/2003 | Fujiwara et al. | .......... | 360/324.1 |
| 6,714,390 B2 * | 3/2004 | Terada et al. | ........... | 360/324.12 |
| 6,717,777 B2 * | 4/2004 | Den et al. | .................... | 360/324 |
| 6,847,509 B2 * | 1/2005 | Yoshikawa et al. | ..... | 360/324.12 |
| 6,937,447 B2 * | 8/2005 | Okuno et al. | ............ | 360/324.1 |
| 2003/0104249 A1 * | 6/2003 | Okuno et al. | ............... | 428/693 |

FOREIGN PATENT DOCUMENTS

| | | |
|---|---|---|
| JP | 63-142689 A | 6/1988 |
| JP | 9-306733 A | 11/1997 |
| JP | 11-510911 A | 9/1999 |
| JP | 2003-204095 A | 7/2003 |

OTHER PUBLICATIONS

N. Garcia, et al.: "Magnetoresistance in Excess of 200% in Ballistic NI Nanocontacts at Room Temperature and 100 OE", Physical Review Letters, vol. 82, No. 14, Apr. 5, 1999, pp. 2923.

(Continued)

*Primary Examiner*—Craig A Renner
(74) *Attorney, Agent, or Firm*—Sughrue Mion, PLLC

(57) ABSTRACT

A magnetoresistance effect element includes a free layer as a first ferromagnetic layer, a pinned layer as a second ferromagnetic layer, and at least one nano-junction provided between the free layer and the pinned layer. The nano-junction contains at least one non-metal selected from the group consisting of oxygen, nitrogen, sulfur and chlorine. Preferably, the material for forming the nano-junction is a ferromagnetic metal selected from the group consisting of Fe, Ni, Co, NiFe, CoFe and CoFeNi or a halfmetal selected from the group consisting of NiFeSb, NiMnSb, PtMnSb and MnSb.

24 Claims, 4 Drawing Sheets

OTHER PUBLICATIONS

N. Garcia, et al.: "Balistic Magnetoresistance in Nanocontacts Electrochemically Grown Between Macro- and Microscopic Ferromagnetic Electrodes", Applied Physics Letters, vol. 80, No. 10, Mar. 11, 2002, pp. 1785.

G. Tatara, et al.: "Domain Wall Scattering Explains 300% Ballistic Magnetoconductance of Nanocontacts", Physical Review Letters, vol. 83, No. 10, Sep. 6, 1999, pp. 2030.

Japanese Office Action dated Feb. 23, 2009.

J.J. Versluijs et al., "Magnetoresistance of Half-Metallic Oxide Nanocontacts", Physical Review Letters, Jul. 9, 2001, pp. 026601-1-4, vol. 87, No. 2, The American Physical Society.

Nikos Papanikolaou, "Magnetoresistance Through Spin-Polarized P States", Journal of Physics: Condensed Matter, 2003, pp. 5049-5055, Matter 15, Institute of Physics Publishing.

Ryougo Kubo et al., Japanese Terminology Glossary, $4^{TH}$ edition 1987, p. 1006, Iwanamishoten.

* cited by examiner

MAGNETORESISTANCE EFFECT ELEMENT WITH NANO-JUNCTION BETWEEN FREE AND PINNED LAYERS

The present application claims foreign priority based on Japanese patent application no. 2003-427975, filed on Dec. 24, 2003, the entire contents of which is incorporated herein by reference.

BACKGROUND OF THE INVENTION

1. Field of the Invention

The present invention relates to a magnetoresistance effect element and a magnetic head. More particularly, the present invention relates to a magnetoresistance effect element having a BMR (Ballistic Magneto Resistance) effect and a magnetic head.

2. Related Art

In the related art, the GMR (Giant Magnetoresistance) effect is a phenomenon in which a large magnetoresistance change is exhibited when an electric current is applied to a plane of a laminated structure having a ferromagnetic layer, a non-magnetic layer and a ferromagnetic layer. A GMR element has been investigated actively in pursuit of achievement of a higher magnetoresistance ratio (hereinafter referred to as MR ratio).

A related art ferromagnetic tunnel junction or a CPP (Current Perpendicular to Plane) type GMR element for perpendicularly applying an electric current to a laminated structure has been developed for possible use as a magnetic head or a magnetic random access memory (MRAM).

Additionally, in the field of magnetic recording technology, recording bit size has been reduced with improvements in recording density. As a result, it has become more difficult to obtain sufficient readout signal strength. Therefore, there is a related art need for a material exhibiting a more sensitive magnetoresistance effect. Further, there is also a related art need for development of an element exhibiting a high MR ratio.

Recently in the related art, a "magnetic nanocontact" having two nickel (Ni) wires butted against each other was disclosed to exhibit a magnetoresistance effect of 100% or higher (e.g. see N. Garcia, M. Munoz, and Y.-W. Zhao, Physical Review Letters, vol. 82, p 2923 (1999)).

More recently, in a related art magnetic nanocontact, two fine Ni wires were arranged in a T-configuration and a nano-column was grown in a contact portion between the Ni wires by a related art electrodeposition process (e.g. see N. Garcia et al., Appl. Phys. Lett., vol. 80, p 1785 (2002)). The resulting related art element exhibited a very high MR ratio due to spin transport of magnetic domains present in the magnetic nano-contact formed between the two ferromagnetic layers having antiparallel directions of magnetization.

A related art magnetoresistance effect element using the above-described related art magnetic nanocontact is called a Ballistic Magneto Resistance (BMR) element because electrons pass through the magnetic nanocontact (ballistically) without change of their spin direction.

For example, Japanese Patent Laid-Open No. 2003-204095 discloses a magnetoresistance effect element including a first ferromagnetic layer, an electrically insulating layer, and a second ferromagnetic layer, wherein a hole having an opening with a maximum width of not larger than 20 nm is provided in a predetermined position of the electrically insulating layer so that the first and second ferromagnetic layers can be connected to each other. In addition, International Patent Publication No. 510911/1999 discloses a magnetoresistance effect element, including two magnetic layers connected to each other through a narrow portion having a width of about 100 nm.

G. Tatara et al., Physical Review Letters, vol. 83(10), p 2030 (1999) (hereafter "Tatara") discloses the theoretical consideration about the magnetoresistance effect of this type BMR element. Tatara discloses a proposed magnetoresistance ratio (MR ratio) is given by Expression 1. In Expression 1, F(P, t) is the probability that electrons will reflect on a magnetic wall formed in the nano-junction, F(P, t) takes a value in a range from 0 to 1, and P is the electron spin polarization of the material for forming the nano-junction, and has a value in a range of from 0 to 1. In the expression 1, t is the thickness of the magnetic wall. The disclosed Expression 1 apparently indicates that a high magnetoresistance ratio (MR ratio) can be obtained when the electron spin polarization of the material for forming the nano-junction is increased.

[Expression 1] (1)

$$BMR = \frac{\pi^2}{4} \frac{P^2}{1-P^2} F(P, t)$$

When the aforementioned BMR element is used in a magnetic head, the related art BMR element must be produced at practicable cost, and the BMR element must have a higher MR ratio in terms of characteristic.

However, most disclosed related art BMR elements have complex element structures, because the related art BMR elements are developed with an emphasis on their characteristic nature.

Further, according to the theoretical consideration disclosed in Tatara's work, it can be conceived that the method of forming the electron spin polarization of the material of the nano-junction is effective in obtaining a high magnetoresistance ratio that approaches 1. However, no related art method has been proposed for the BMR element having a simple element structure that can be produced.

SUMMARY OF THE INVENTION

One goal of the present invention is to overcome at least the above-mentioned related art problem. A first object of the invention is to provide a magnetoresistance effect element which has a simple element structure that can be produced with a higher magnetoresistance ratio. A second object of the invention is to provide a magnetic head using the magnetoresistance effect element.

To achieve the first object, the invention provides a magnetoresistance effect element including a free layer as a first ferromagnetic layer, a pinned layer as a second ferromagnetic layer, and at least one nano-junction provided between the free layer and the pinned layer, wherein the nano-junction contains at least one non-metal selected from the group consisting of oxygen, nitrogen, sulfur and chlorine. The pinned layer refers to a ferromagnetic layer which its magnetization direction is fixed by exchange coupling with an antiferromagnetic layer or just by having a high coercivity.

According to the invention, the nano-junction provided between the free layer and the pinned layer contains at least one non-metal selected from the group consisting of oxygen, nitrogen, sulfur and chlorine. Thus, the electron spin polarization of the nano-junction approaches 1. As a result, a high magnetoresistance ratio (MR ratio) can be achieved. Since the nano-junction is provided between the free layer as the first ferromagnetic layer and the pinned layer as the second ferromagnetic layer, the magnetoresistance effect element according to the invention is provided as a simple and practical structure.

Preferably, in the magnetoresistance effect element according to the invention, (i) the material for forming the nano-junction is a ferromagnetic metal selected from the group consisting of Fe, Ni, Co, NiFe, CoFe and CoFeNi or a halfmetal selected from the group consisting of NiFeSb, NiMnSb, PtMnSb and MnSb; and (ii) the first and second ferromagnetic layers are made of a ferromagnetic metal selected from the group consisting of Fe, Ni, Co, NiFe, CoFe and CoFeNi.

According to the invention, the material for forming the nano-junction, the material for forming the first ferromagnetic layer and the material for forming the second ferromagnetic layer are selected from the aforementioned list. Accordingly, the magnetoresistance effect element having a high magnetoresistance ratio can be produced.

Preferably, in the magnetoresistance effect element according to the invention, the non-metal is present in an interface between the nano-junction and the free layer and/or in an interface between the nano-junction and the pinned layer.

In the invention, for example but not by way of limitation, a non-metallic compound containing the non-metal to be diffused into the nano-junction is provided in the interface between the nano-junction and the free layer and/or in the interface between the nano-junction and the pinned layer to thereby form a simple structure. After the formation of the simple structure, the non-metal is diffused from the non-metallic compound into the nano-junction.

As a result, the non-metal still remains in the interface between the nano-junction and the free layer and/or in the interface between the nano-junction and the pinned layer while the non-metal is contained in the nano-junction by means of diffusion or the like. According to the configuration of the invention, a magnetoresistance effect element having a high MR ratio can be produced.

Preferably, in the magnetoresistance effect element according to the invention, the non-metal or a non-metallic compound containing the non-metal is present in grain boundaries of crystal grains which form the nano-junction.

According to the invention, the non-metal is present in the grain boundaries of crystal grains which form the nano-junction. Thus, the electron spin polarization of the nano-junction can increase. As a result, a high magnetoresistance ratio (MR ratio) can be achieved.

To achieve the second object, the invention provides a magnetic head including a magnetoresistance effect element defined above.

According to the invention, the magnetoresistance effect element has a simple element structure that can be produced at practicable cost and has a higher magnetoresistance ratio. Accordingly, a magnetic head having a high magnetoresistance ratio can be produced.

As described above, in the magnetoresistance effect element according to the invention, the electron spin polarization of the nano-junction approaches 1 so that a high magnetoresistance ratio (MR ratio) can be achieved. Moreover, since the magnetoresistance effect element according to the invention has a simple structure excellent in practicality, the magnetoresistance effect element according to the invention can be produced at practicable cost.

According to the invention, the magnetoresistance effect element high in stability and sensitivity is used in the magnetic head so that the magnetic head can be provided as a high-stability, high-performance magnetic head.

While the foregoing objects are provided, the present invention may be practiced by achieving other objects, or none of the above-disclosed objects. Further, it is not required for the present invention to achieve any objects at all, and in such a case, the scope of the invention is not reduced.

DETAILED DESCRIPTION OF THE INVENTION

A magnetoresistance effect element according to the present invention and a magnetic head having the magnetoresistance effect element are described below with reference to the drawings.

The scope of the invention is not limited to the following embodiments, and equivalents thereof as may be understood by those of ordinary skill in the art may also be considered as within the scope of the present invention. If alternate definitions are necessary, those definitions are operationally provided in this specification.

Figure 1:
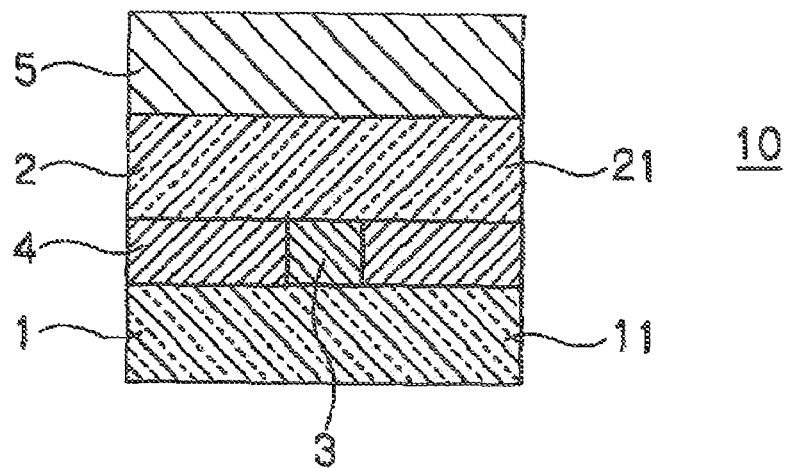
FIG. 1 is a sectional view showing a magnetoresistance effect element according to an exemplary, non-limiting embodiment of the present invention.
Figure 2:
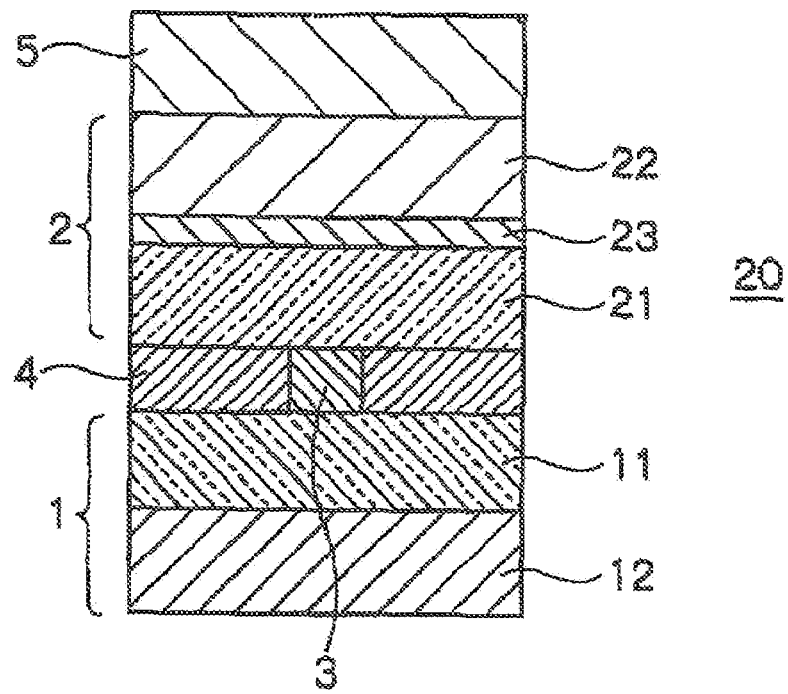
FIG. 2 is a sectional view showing a magnetoresistance effect element according to another exemplary, non-limiting embodiment of the present invention.

FIG. 1 is a sectional view taken along a direction of lamination and showing an exemplary, non-limiting magnetoresistance effect element according to the present invention. FIG. 2 is a sectional view taken along a direction of lamination and showing another exemplary, non-limiting magnetoresistance effect element according to the present invention.

As shown in FIG. 1, the magnetoresistance effect element 10 according to the invention includes a free layer 1 as a first ferromagnetic layer 11, a pinned layer 2 as a second ferromagnetic layer 21, and at least one nano-junction 3 provided between the free layer 1 and the pinned layer 2. The free layer 1 and the pinned layer 2 are disposed so that the at least one nano-junction 3 is sandwiched between the free layer 1 and the pinned layer 2. The magnetoresistance effect element 10 further includes an antiferromagnetic (AFM) layer 5 provided on the pinned layer 2 and on a side opposite to the nano-junction 3 side.

The magnetoresistance effect element 20 according to the invention shown in FIG. 2 is different from the magnetoresistance effect element 10 shown in FIG. 1 in that the free layer 1 includes two ferromagnetic layers 11 and 12, while the pinned layer 2 includes two ferromagnetic layers 21 and 22, and a non-magnetic layer 23 provided between the two ferromagnetic layers 21 and 22.

(Nano-Junction)

The nano-junction 3 is mainly made of a ferromagnetic metal selected from the group consisting of Fe, Ni, Co, NiFe, CoFe and CoFeNi, or a halfmetal selected from the group consisting of NiFeSb, NiMnSb, PtMnSb and MnSb. These materials are ferromagnetic materials having spin polarization of not smaller than about 0.5.

The magnetoresistance effect element according to the invention is characterized in that the nano-junction 3 comprising the aforementioned material contains at least one non-metal selected from the group consisting of oxygen (O), nitrogen (N), sulfur (S) and chlorine (Cl). The nano-junction 3 contains such a non-metal that the electron spin polarization of the ferromagnetic metal or ferromagnetic halfmetal which is the main component of the nano-junction 3 can be made to substantially approach 1 as compared with the case where the nano-junction 3 does not contain any non-metal.

The nano-junction 3 made of the constituent material having spin polarization substantially approaching 1 increases the magnetoresistance ratio (MR ratio) of the magnetoresistance effect element. The spin polarization of the constituent material of the nano-junction 3 approaches 1 when the nano-junction 3 contains such a non-metal. As understood from Expression 1 proposed by Tatara, the MR ratio of the magnetoresistance effect element can be increased.

The non-metal contained in the nano-junction 3 can be selected suitably from the aforementioned list in accordance with the constituent material of the nano-junction 3. It is preferable to suitably select a non-metal which can make the spin polarization of the constituent material of the nano-junction 3 approach 1 to exhibit a high MR ratio. From the viewpoint of the element's spin polarization, it is particularly preferable to contain oxygen as the non-metal. The non-metal content which can make the spin polarization of the constituent material of the nano-junction 3 approaches 1 to exhibit a high MR ratio can thus be selected suitably. Generally, the non-metal content is selected to be in a range from about 1 atomic % to 30 atomic %.

Next, the size (scale) of the nano-junction 3 is described.

Figure 3:
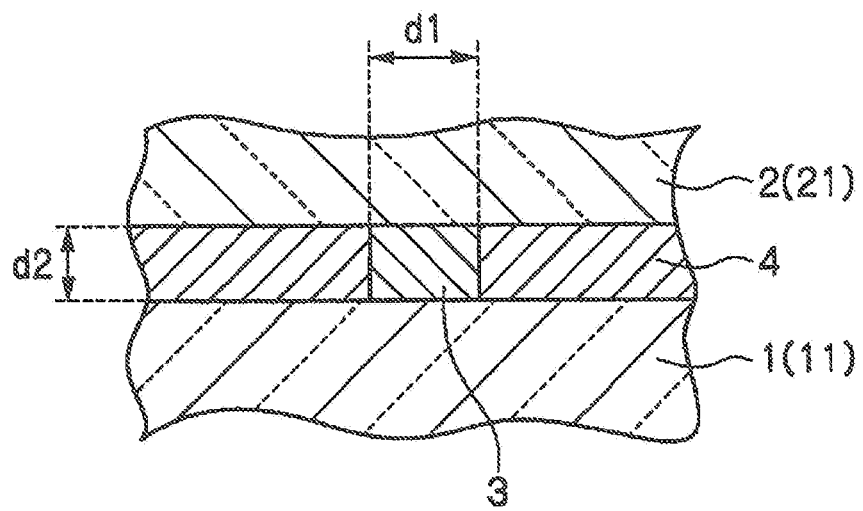
FIG. 3 is an enlarged sectional view of a nano-junction according to an exemplary, non-limiting embodiment of the present invention as depicted in FIG. 1.

FIG. 3 is an enlarged view of the nano-junction 3 which is a constituent member of the magnetoresistance effect element 10 or 20 respectively depicted in FIG. 1 or 2. The length d1 of the nano-junction 3 taken in the widthwise direction (i.e., perpendicular to the direction of lamination) is set to be not larger than the Fermi length. The nano-junction 3 is shaped like one of a circle, an ellipse, a polygon (such as a triangle, a quadrangle, etc.) or an approximation thereto as the shape appearing in the in-plane direction (two-dimensional direction forming a plane perpendicular to the direction of lamination) of the magnetoresistance effect element 10 or 20 shown in FIG. 1 or 2. For this reason, the length d1 taken in the widthwise direction is defined as the "maximum length d1 in the in-plane direction of the nano-junction 3" in the magnetoresistance effect element 10 shown in FIG. 1. Accordingly, the maximum length d1 is set to be not larger than the Fermi length.

The Fermi length concerning the length d1 of the nano-junction 3 taken in the widthwise direction has a value specific to the material. The Fermi length varies according to the ferromagnetic material which is a constituent member of the nano-junction 3. In most cases, the ferromagnetic material exhibits a Fermi length from about 60 nm to about 100 nm. Accordingly, the phrase "not larger than the Fermi length" can be specifically directed to the phrase "not larger than about 100 nm" or "not larger than about 60 nm" in this exemplary, non-limiting embodiment. Specific examples of the Fermi length are as follows: about 60 nm for Ni, and about 100 nm for Co.

It is more preferable that the length d1 of the nano-junction 3 taken in the widthwise direction is not larger than the electron mean free path. The electron mean free path also has a value specific to the material. The electron mean free path varies according to the ferromagnetic material which is a constituent member of the nano-junction 3. In most cases, the ferromagnetic material exhibits an electron mean free path of about 5 nm to about 15 nm. Accordingly, the phrase "not larger than the mean free path" is directed to "not larger than about 15 nm" or "not larger than about 5 nm" in this exemplary, non-limiting embodiment. Specific examples of the mean free path are as follows: about 5 nm for NiFe, and about 12 nm for Co.

On the other hand, the distance between the free layer 1 and the pinned layer 2, which distance is formed to have the nano-junction 3 sandwiched between the free layer 1 and the pinned layer 2 (that is, the length d2 of the nano-junction 3 taken in the direction of lamination (height) as shown in FIG. 3), as well as the length d1 taken in the widthwise direction, is preferably set to be not larger than the Fermi length and is more preferably set to be not larger than the mean free path.

If both the length d1 of the nano-junction 3 taken in the widthwise direction and the length d2 of the nano-junction 3 taken in the direction of lamination are larger than the Fermi length, electrons passing through the nano-junction 3 can hardly hold spin information because the magnetic wall of the nano-junction 3 becomes very thick when the direction of magnetization is antiparallel. As a result, it may be difficult to obtain the magnetoresistance effect caused by the change of the direction of magnetization. In this invention, therefore, the size of the nano-junction 3 is preferably set to be not larger than the Fermi length and is more preferably set to be not larger than the electron mean free path in order to obtain an effect in holding the spin information well.

When both the length d1 of the nano-junction 3 taken in the widthwise direction and the length d2 of the nano-junction 3 taken in the direction of lamination are not larger than the Fermi length, the nano-junction 3 serves as a portion for generating a very thin magnetic wall to change the relative arrangement of magnetization between the free layer 1 and the pinned layer 2 with the nano-junction 3 being sandwiched between the free layer 1 and the pinned layer 2. Thus, the electric resistance between the free layer 1 and the pinned layer 2 changes.

The magnetic wall of the nano-junction 3 serves as a region of transition to two portions (the free layer 1 side ferromagnetic layer 11 and the pinned layer 2 side ferromagnetic layer 21 disposed so that the nano-junction 3 is sandwiched between the ferromagnetic layers 11 and 21) different in the direction of magnetization. As a result, a large magnetoresistance effect is generated in accordance with the direction of magnetization of the free layer.

As described above, the magnetoresistance effect element according to the invention includes the nano-junction 3 containing at least one non-metal selected from the group consisting of oxygen (O), nitrogen (N), sulfur (S) and chlorine (Cl) so that the electron spin polarization of the nano-junction can be made to approach 1. Accordingly, the magnetoresistance effect element according to the invention can exhibit a high magnetoresistance ratio. Incidentally, the magnetoresistance ratio is an MR ratio ($\Delta R/R$) which is defined by the ratio of change $\Delta R$ in electrical resistance according to change in applied magnetic field to electric resistance R based on sufficient high magnetic field intensity.

The periphery of the nano-junction 3, that is, the other portion than the at least one nano-junction 3 provided between the free layer 1 and the pinned layer 2 is formed as a non-magnetic layer 4. The non-magnetic layer 4 is made of an electrically insulating material. Examples of the electrically insulating material include (but are not limited to) oxides such as aluminum oxide, silicon oxide; and nitrides such as silicon nitride. The length of the non-magnetic layer 4 taken in the direction of lamination is set to be substantially equal to the length d2 of the nano-junction 3 taken in the direction of lamination.

The ferromagnetic layers 11 and 21 disposed so that at least one nano-junction 3 is sandwiched therebetween are the ferromagnetic layer (first ferromagnetic layer 11) of the free layer 1 disposed on the nano-junction side, and the ferromagnetic layer (second ferromagnetic layer 21) of the pinned layer 2 disposed on the nano-junction side. Each of the ferromagnetic layers 11 and 21 is made of a ferromagnetic material having spin polarization of not lower than about 0.5. Any ferromagnetic material may be used as the ferromagnetic material. For example but not by way of limitation, a ferromagnetic metal selected from the group consisting of Fe, Ni, Co, NiFe, CoFe and CoFeNi is preferably used as the ferromagnetic material for forming the nano-junction 3.

When the material for forming the nano-junction 3 is substantially the same as the material for forming the ferromagnetic layers 11 and 21 adjacent to the nano-junction 3, the structure can be produced relatively easily because a technique for forming a granular structure as a film can be used substantially as well as a single material for film-forming and etching.

The magnetoresistance effect element 10 or 20 according to the invention can be provided as a simple structure excellent in practicality because the nano-junction 3 is provided between the first and second ferromagnetic layers 11 and 21. Accordingly, the magnetoresistance effect element 10 or 20 according to the present invention can be produced at practicable cost.

Next, a method for making a non-metal contained in the nano-junction 3 is described.

At least one non-metal selected from the group consisting of oxygen, nitrogen, sulfur and chlorine may be contained in the nano-junction 3 when the nano-junction 3 is formed as a film. For example but not by way of limitation, sputtering may be performed when oxygen, nitrogen or the like is contained, when the ferromagnetic material which is a constituent material of the nano-junction is subjected to film-forming. In this case, the non-metal can be contained in the nano-junction 3 at the same time that the nano-junction 3 is formed as a film.

Alternatively, the non-metal may be contained in the nano-junction 3 after the nano-junction 3 is formed as a film. For example but not by way of limitation, annealing (heat treatment) may be performed after the nano-junction 3 is formed as a film. In this case, the non-metal can be thermally diffused into the nano-junction 3.

Figure 4:
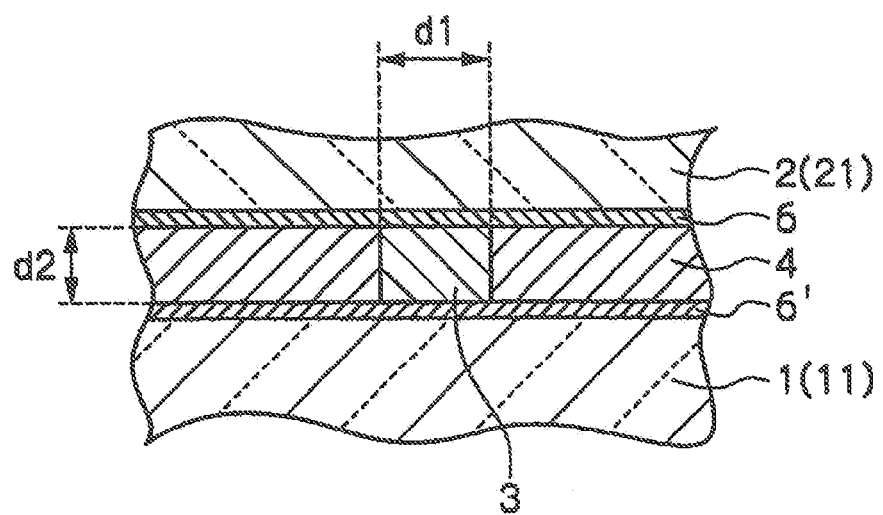
FIG. 4 is a sectional view showing an exemplary, non-limiting corresponding structure for the function of making a non-metal contained in the nano-junction according to the exemplary, non-limiting embodiment of the present invention.

FIG. 4 shows an example of the method for making the non-metal contained in the nano-junction according to an exemplary, non-limiting embodiment of the present invention. Two layers 6 and 6' are respectively formed in the interface between the nano-junction 3 and the free layer 1 and in the interface between the nano-junction 3 and the pinned layer 2. Each of the layers 6 and 6' contains a non-metallic compound having at least one non-metal selected from the group consisting of oxygen, nitrogen, sulfur and chlorine. Further, each of the layers 6 and 6' may be made of the non-metallic compound or may be a layer containing a large amount of non-metal provided when the ferromagnetic layer (11 or 21) for forming the free layer 1 or the pinned layer 2 is formed as a film.

In the magnetoresistance effect element according to the present invention, when annealing is performed after the structure shown in FIG. 4 is formed, the non-metal contained in the layers 6 and 6' can be contained in the nano-junction 3 by thermal diffusion or the like. After completion of the diffusion or the like, the non-metal diffused into the nano-junction 3 still remains in the interface between the nano-junction 3 and the free layer 1 and/or the pinned layer 2.

In this manner, since diffusing treatment or the like is made after formation of a simple structure in which the layers 6 and 6' containing the non-metallic compound are provided in the interface between the nano-junction 3 and the free layer 1 and/or in the interface between the nano-junction 3 and the pinned layer 2, respectively, configuration can be made so that the non-metal is contained in the nano-junction 3 by diffusion or the like, while the non-metal remains in the interface between the nano-junction 3 and the free layer 1 and/or in the interface between the nano-junction 3 and the pinned layer 2. According to the present invention, there can be provided a magnetoresistance effect element which has a high MR ratio and can be produced at practicable cost.

Figure 5:
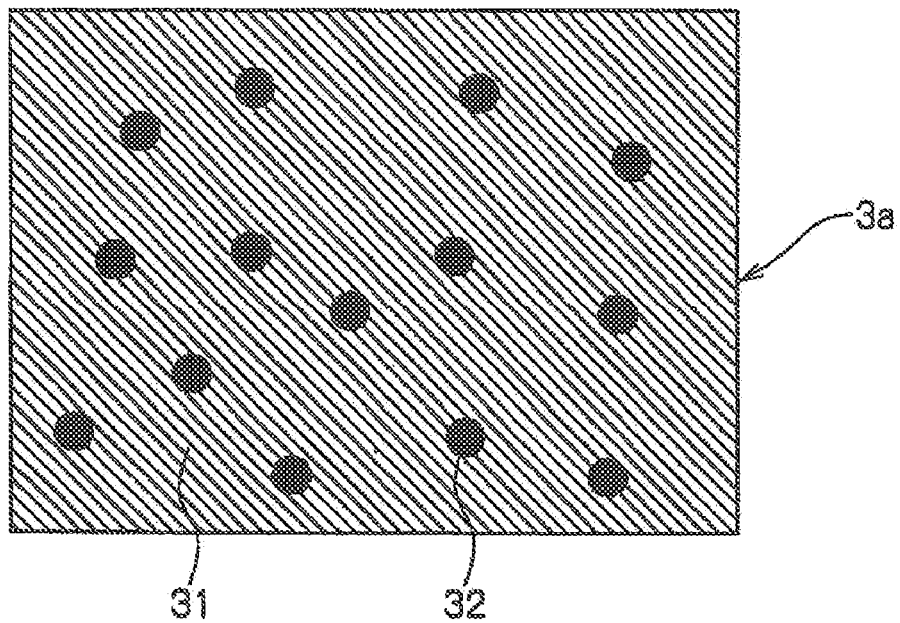
FIG. 5 shows an exemplary, non-limiting configuration of the present invention in which the non-metal is contained in the nano-junction.
Figure 6:
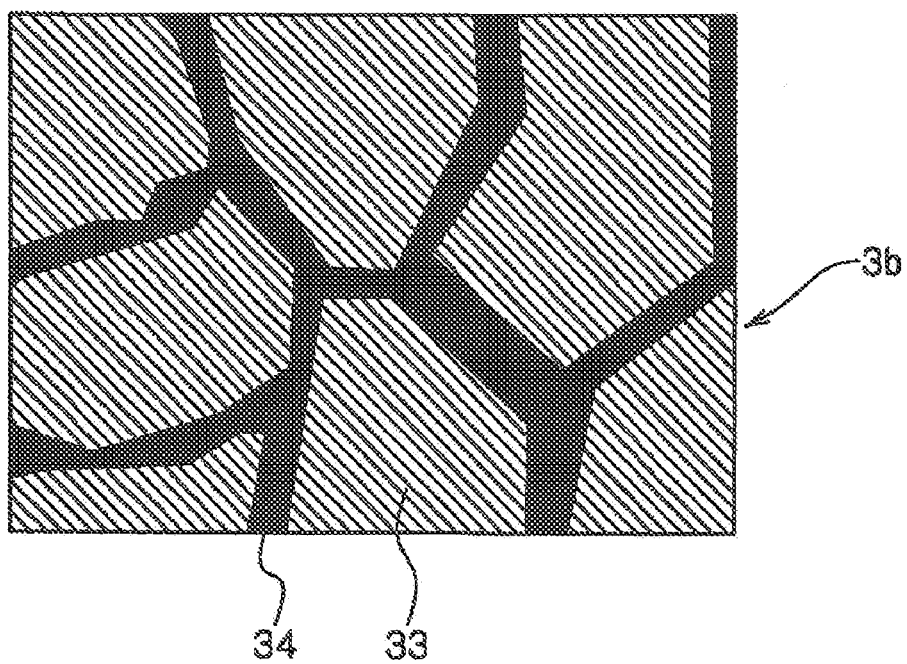
FIG. 6 shows another exemplary, non-limiting configuration of the present invention in which the non-metal is contained in the nano-junction.

FIG. 5 shows an exemplary, non-limiting configuration according to the present invention, in which a non-metal 32 is contained in a constituent material 31 of a nano-junction 3a so that the non-metal 32 is not localized. FIG. 6 shows another exemplary, non-limiting configuration according to the present invention in which a non-metal in an atomic state or in a state of a non-metallic compound containing the non-metal is present in grain boundaries 34 of crystal grains 33, which forms a nano-junction 3b. The form of the non-metal contained in the nano-junction varies according to the kind of the constituent material of the nano-junction and the kind of the non-metal.

In the magnetoresistance effect element obtained in this manner, at least one non-metal selected from the group consisting of oxygen, nitrogen, sulfur and chlorine is diffused from the layers 6 and 6' formed in the interface between the nano-junction 3 and the free layer 1 and/or in the interface between the nano-junction 3 and the pinned layer 2 so that the non-metal is contained in the nano-junction 3. Thus, the electron spin polarization of the nano-junction 3 substantially approaches 1. As a result, a high magnetoresistance ratio (MR ratio) can be achieved.

Moreover, there can be provided such a simple structure that the non-metallic compound containing the non-metal to be diffused into the nano-junction 3 is provided in the interface between the nano-junction 3 and the free layer 1 and/or in the interface between the nano-junction 3 and the pinned layer 2. Then, the non-metal can be diffused from the non-metallic compound into the nano-junction 3 to form a magnetoresistance effect element having the nano-junction 3 containing the non-metal. Accordingly, the magnetoresistance effect element having a high MR ratio can be produced by a simple element structure and process.

Alternatively, the nano-junction 3 may be produced by nano-lithography such as electron beam exposure, or may be produced by a general method such as sputtering or vapor deposition, so that the non-metal can be provided in the form of crystal grains or in a localized state.

(Free Layer)

The free layer 1 responds to the magnetic field generated from a magnetization transition region of a recording medium to there by operate so that the direction of magnetization rotates or switches. It is preferable that the direction of the magnetization easy-axis of the free layer 1 is limited to be substantially parallel to the medium. As shown in FIG. 2, the free layer 1 is preferably formed from two ferromagnetic layers 11 and 12. Each of the ferromagnetic layers 11 and 12 is generally formed to have a thickness of about 0.5 nm to about 5 nm. The ferromagnetic layers 11 and 12 can be coupled to each other ferromagnetically or antiferromagnetically.

When the two ferromagnetic layers 11 and 12 exhibit ferromagnetic coupling, the ferromagnetic layer 12 disposed in a position far from the nano-junction 3 can be formed of a material high in polarization while the ferromagnetic layer 11 disposed in a position adjacent to the nano-junction 3 can be formed of a soft magnetic material with low magnetostriction. When such a combination of ferromagnetic layers 11 and 12 is used for forming the free layer 1, both high sensitivity and broad linear operation can be secured.

On the other hand, when the two ferromagnetic layers 11 and 12 exhibit an antiferromagnetic coupling, a non-magnetic layer (not shown) is provided between the two ferromagnetic layers 11 and 12. When such a structure is provided, the two ferromagnetic layers 11 and 12 are coupled to each other in antiparallel through the non-magnetic layer. For at least this reason, magnetization of the two ferromagnetic layers 11 and 12 included in the free layer 1 is stabilized, so that the total stability of the element can be improved.

The non-magnetic layer serves as a layer for adjusting the degree of coupling between the two ferromagnetic layers 11 and 12. For example but not by way of limitation, the non-magnetic layer is made of a material selected from the group consisting of Ru, Rh, Ir, Cu, Ag, Au and alloys thereof. Examples of the material for forming the ferromagnetic layers 11 and 12 exhibiting an antiferromagnetic coupling include CoFe and NiFe.

(Pinned Layer)

As shown in FIG. 2, the pinned layer (also called pin layer) 2 is preferably formed from two ferromagnetic layers 21 and 22. In such a pinned layer 2, the ferromagnetic layers 21 and 22 are formed with interposition of a non-magnetic layer 23.

Any kind of ferromagnetic material having spin polarization of not smaller than about 0.5 can be used as the material of each of the two ferromagnetic layers 21 and 22 which preferably form the pinned layer 2. In this case, the two ferromagnetic layers 21 and 22 may be formed of one material or may be formed of different materials. Each of the layers 21 and 22 is generally formed to have a thickness of about 2 nm to about 10 nm.

The non-magnetic layer 23 sandwiched between the ferromagnetic layers 21 and 22 is made of a material selected from the group consisting of Ru, Rh, Ir, Cu, Ag, Au and alloys thereof. The non-magnetic layer 23 is generally formed to have a thickness of about 0.5 nm to about 2 nm. The two ferromagnetic layers 21 and 22 spaced by the non-magnetic layer 23 have their respective magnetizations in opposite direction. In this configuration, the total magnetization of the ferromagnetic layer 2 is stabilized.

Turning to the antiferromagnetic layer 5, which is preferably provided on the pinned layer 2 and on a side opposite to a side on which the nano-junction 3 is provided, one material selected from the group consisting of PtMn, IrMn, PtPdMn and FeMn is preferably used as the forming material. The antiferromagnetic layer 5 is generally formed to have a thickness of about 5 nm to about 10 nm. By the provision of the antiferromagnetic layer 5, strong coupling is induced so that the magnetization direction of the ferromagnetic layer acting as the pinned layer 2 can be fixed. As a result, magnetization of the pinned layer 2 is fixed intensively so that it will not change direction during the readout operation.

Although the magnetoresistance effect element has been described above with reference to FIGS. 1 and 2, the magnetoresistance effect element according to the invention may be provided as any one of a bottom type laminated structure, a top type laminated structure and a dual type laminated structure. That is, the magnetoresistance effect element according to the invention may be configured so that the combination of the ferromagnetic layers 11 and 12 forming the free layer 1 and the combination of the ferromagnetic layers 21 and 22 forming the pinned layer 2 are replaced by each other.

In the magnetoresistance effect element according to the present invention, the ferromagnetic layer forming the free layer and the ferromagnetic layer forming the pinned layer serve as electrodes, or electrodes connected to the ferromagnetic layers are provided separately. The electrical resistance obtained between the free layer and the pinned layer when an electric current is applied between the electrodes, varies according to the relative arrangement of magnetization between the free layer and the pinned layer. In the magnetoresistance effect element according to the present invention, the two ferromagnetic layers 11 and 21 between which the nano-junction 3 is sandwiched have stratified planes, so that magnetic domains can be controlled easily.

Accordingly, the state of distribution of magnetization can be arranged. The two ferromagnetic layers 11 and 21 need not be strictly flat layers, that is, may have some rough surfaces or curved surfaces. The invention may be configured so that at least one nano-junction 3 is formed, that is, a single nano-junction 3 is formed or nano-junctions 3 are formed. The magnetoresistance effect element according to the invention is preferably configured so that an angle of about 90° or about 180° is formed between the direction of magnetization of the ferromagnetic layer forming the free layer and the direction of magnetization of the ferromagnetic layer forming the pinned layer. An initial angle of 90° is preferred so that a linear operation of the sensor can be made easily.

As described above, in the magnetoresistance effect element according to the present invention, the electron spin polarization of the nano-junction approaches 1 so that a high magnetoresistance ratio (MR ratio) can be achieved. In addition, the magnetoresistance effect element according to the invention is provided as a simple structure.

(Magnetic Head)

The magnetic head according to the present invention has high reproduction sensitivity because a high magnetoresistance ratio can be achieved when the aforementioned magnetoresistance effect element is used in the magnetic head.

Figure 7:
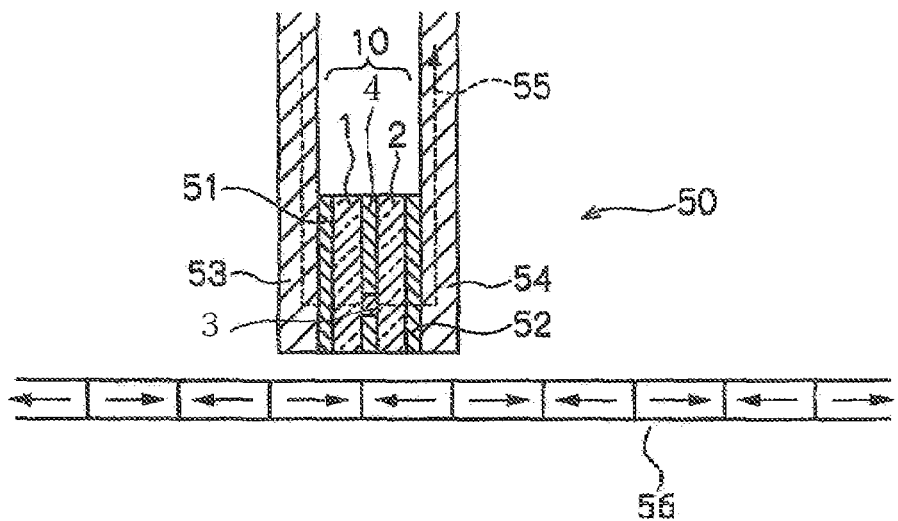
FIG. 7 shows a magnetic head using the magnetoresistance effect element as a magnetic reproducing element, according to an exemplary, non-limiting embodiment of the present invention.

FIG. 7 shows an exemplary, non-limiting magnetic head using the magnetoresistance effect element according to the present invention as a magnetic reproducing element. In the magnetic head 50 shown in FIG. 7, film surfaces of the magnetoresistance effect element 10 are disposed between two shields which are used to avoid magnetic flux from adjacents bits and also to supply the sense current. The nano-junction 3 is disposed between the free layer 1 and pinned layer 2.

In FIG. 7, in the magnetoresistance effect element 10, the free layer 1, the pinned layer 2 and the nano-junction 3 provided between the free layer 1 and the pinned layer 2 are shown as main constituent members for the sake of convenience. For example a buffer layer and capping layer are not shown in the figure. In FIG. 7, the reference numerals 51 and 52 designate electrodes provided in the magnetoresistance effect element 10, the reference numerals 53 and 54 designate shielding members, and the reference numeral 55 designates a sense current. The two electrodes 51 and 52 may not be necessary and in this case the two shields can be used for supplying the sense current. Although FIG. 7 shows the case where a horizontally magnetized film is used as the recording medium, the invention may also be applied to the case where a vertically magnetized film is used as the recording medium.

Figure 8:
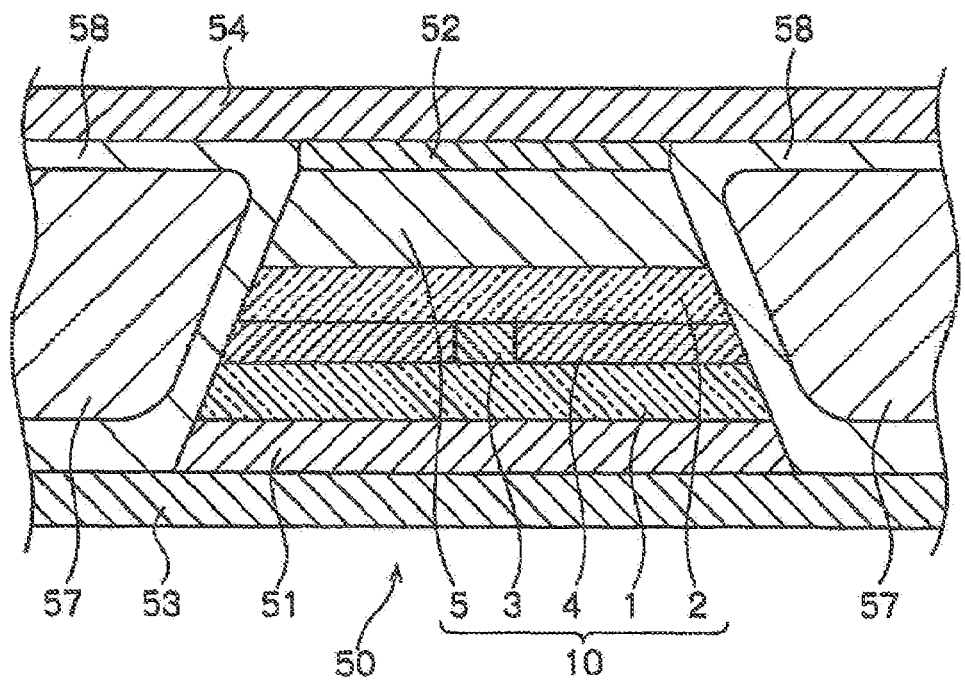
FIG. 8 is a configuration view showing another exemplary, non-limiting embodiment of the magnetic head according an exemplary, non-limiting embodiment of the present invention.

FIG. 8 is a typical view showing an example of a sectional structure in the case where the structure of the magnetic head 50 depicted in FIG. 7 is viewed from the recording medium 56 side (air bearing surface). The magnetic head 50 is provided with the magnetoresistance effect element 10 which at least includes a free layer 1, a pinned layer 2, and a nano-junction 3 sandwiched between the free layer 1 and the pinned layer 2. An antiferromagnetic layer 5 is provided so as to be adjacent to the pinned layer 2. Electrodes 51 and 52 are provided on opposite sides of the magnetoresistance effect element 10. A pair of permanent magnet layers 57 may be provided in the left and right when FIG. 8 is viewed from the front.

For example but not by way of limitation, FIG. 8 shows the structure of the magnetoresistance effect element 10 viewed from the recording medium side. The electrode 51, the free layer 1, the non-magnetic layer 4 provided with the nano-junction 3, the pinned layer 2, the antiferromagnetic layer 5 and the electrode 52 are disposed in order when the magnetoresistance effect element 10 is viewed from the lower shielding member 53 to the upper shielding member 54 in FIG. 8. The pair of permanent magnet 57 is made of CoPt. Reference numeral 58 designates an electrically insulating layer.

The width of the magnetoresistance effect element 10 shown in FIG. 8 is in a range from about 20 nm to about 100 nm. The film thickness of each layer is optimized in a range of from about 0.5 nm to about 20 nm in accordance with recording density and required sensitivity in use. At least one nano-junction 3 is formed to have a size of about 2 nm to about 20 nm.

Additionally, the foregoing embodiments are generally directed to a magnetoresistive element for a magnetoresistive read head. This magnetoresistive read head can optionally be used in any of a number of devices. For example, but not by way of limitation, as discussed above, the read head can be included in a hard disk drive (HDD) magnetic recording device. However, the present invention is not limited thereto, and other devices that use the ballistic magnetoresistive effect may also comprise the magnetoresistive element of the present invention. For example, but not by way of limitation, a magnetic random access memory (i.e., a magnetic memory device provided with a nano-contact structure, or a device) may also employ the present invention.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

The invention claimed is:

1. A magnetoresistance effect element comprising:
a free layer;
a pinned layer; and
at least one nano-junction between said free layer and said pinned layer,
a non-magnetic layer formed between said free layer and said pinned layer in a portion other than said at least one nano-junction;
wherein said at least one nano-junction includes a constituent material and at least one non-metal selected from the group consisting of oxygen, nitrogen, sulfur and chlorine, wherein said constituent material of said nano-junction comprises one of a ferromagnetic metal and a halfmetal, and
wherein said non-metal is contained in said constituent material of said nano-junction so that said non-metal is not localized, or said non-metal in an atomic state or in a state of a non-metallic compound containing said non-metal is present in grain boundaries of crystal grains, which forms said nano-junction.

2. A magnetoresistance effect element according to claim 1, wherein said ferromagnetic metal is selected from the group consisting of Fe, Ni, Go, NiFe, CoFe and CoFeNi.

3. A magnetoresistance effect element according to claim 1, wherein said free layer and said pinned layer each comprises a ferromagnetic metal selected from the group consisting of Fe, Ni, Go, NiFe, CoFe and CoFeNi.

4. A magnetoresistance effect element according to claim 1, wherein said at least one non-metal is present in at least one of (a) an interface between said nano-junction and said free layer, and (b) an interface between said nano-junction and said pinned layer.

5. A magnetoresistance effect element according to claim 1, wherein one of said at least one non-metal and a non-metallic compound containing said non-metal is present in grain boundaries of crystal grains that comprise said nano-junction.

6. The magnetoresistance effect element of claim 1, wherein at least one of said free layer and said pinned layer are made of more than one ferromagnetic layer.

7. The magnetoresistance effect element of claim 1, wherein said nano-junction has a spin polarization that approaches 1, so as to increase a magnetoresistance ratio of said magnetoresistance effect element.

8. The magnetoresistance effect element of claim 1, wherein at least one of a height and a length in a widthwise direction of the nano-junction is one of (a) a Fermi length or less and (b) electron mean free path or less.

9. The magnetoresistance effect element of claim 8, wherein said Fermi length is between about 60 nm and 100 nm, and said electron mean free path is about 15 nm.

10. The magnetoresistance effect element of claim 1, further comprising a non-metallic layer positioned between said nano-junction and at least one of said free layer and said pinned layer.

11. A magnetic head comprising:
a magnetoresistance effect element comprising,
a free layer,
a pinned layer, and
at least one nano-junction positioned between said free layer and said pinned layer,
a non-magnetic layer formed between said free layer and said pinned layer in a portion other than said at least one nano-junction;

wherein said at least one nano-junction includes a constituent material and at least one non-metal selected from the group consisting of oxygen, nitrogen, sulfur and chlorine, wherein said constituent material of said nano-junction comprises one of a ferromagnetic metal and a halfmetal, and wherein said non-metal is contained in said constituent material of said nano-junction so that said non-metal is not localized, or said non-metal in an atomic state or in a state of a non-metallic compound containing said non-metal is present in grain boundaries of crystal grains, which forms said nano-junction.

12. The magnetic head of claim 11, wherein said ferromagnetic metal is selected from the group consisting of Fe, Ni, Go, NiFe, CoFe and CoFeNi.

13. The magnetic head of claim 11, wherein said free layer and said pinned layer each comprises a ferromagnetic metal selected from the group consisting of Fe, Ni, Go, NiFe, CoFe and CoFeNi.

14. The magnetic head of claim 11, wherein said at least one non-metal is present in at least one of (a) an interface between said nano-junction and said free layer, and (b) an interface between said nano-junction and said pinned layer.

15. The magnetic head of claim 11, wherein one of said at least one non-metal and a non-metallic compound containing said non-metal is present in grain boundaries of crystal grains that comprise said nano-junction.

16. The magnetic head of claim 11, wherein at least one of said free and said pinned layer is ferromagnetic.

17. The magnetic head of claim 11, further comprising:
a first electrode coupled to an outer surface of said free layer and a second electrode coupled to an outer surface of said pinned layer; and
a first shielding layer coupled to an outer surface of said first electrode and a second shielding layer coupled to an outer surface of said second electrode, wherein a sensing current flows through said magnetic head.

18. The magnetic head of claim 11, wherein a width of said magnetoresistance effect element is from about 20 nm to about 100 nm, and said nano-junction has a length of about 2 nm to about 20 nm.

19. The magnetic head of claim 11, wherein said nano-junction has a spin polarization that approaches 1, so as to increase a magnetoresistance ratio of said magnetoresistance effect element.

20. A magnetic memory comprising:
a magnetoresistance effect element comprising,
a free layer,
a pinned layer, and
at least one nano-junction positioned between said free layer and said pinned layer,
a non-magnetic layer formed between said free layer and said pinned layer in a portion other than said at least one nano-junction;
wherein said at least one nano-junction includes a constituent material and at least one non-metal selected from the group consisting of oxygen, nitrogen, sulfur and chlorine,
wherein said constituent material of said nano-junction comprises one of a ferromagnetic metal and a halfmetal, and
wherein said non-metal is contained in said constituent material of said nano-junction so that said non-metal is not localized, or said non-metal in an atomic state or in a state of a non-metallic compound containing said non-metal is present in grain boundaries of crystal grains, which forms said nano-junction.

21. A magnetoresistance effect element according to claim 1, wherein said halfmetal is selected from the group consisting of NiFeSb, NiMnSb, PtMnSb and MnSb.

22. A magnetoresistance effect element according to claim 1, wherein said non-metal is contained in said constituent material of said nano-junction so that the non-metal is not localized.

23. A magnetic head according to claim 11, wherein said halfmetal is selected from the group consisting of NiFeSb, NiMnSb, PtMnSb and MnSb.

24. A magnetic head according to claim 11, wherein said non-metal is contained in said constituent material of said nano-junction so that the non-metal is not localized.

* * * * *